(12) United States Patent
Hayakashi et al.

(10) Patent No.: US 11,569,148 B2
(45) Date of Patent: Jan. 31, 2023

(54) SEMICONDUCTOR DEVICE WITH A METAL PLATE

(71) Applicant: Mitsubishi Electric Corporation, Tokyo (JP)

(72) Inventors: Koki Hayakashi, Tokyo (JP); Ryuichi Ishii, Tokyo (JP); Dai Yoshii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 10 days.

(21) Appl. No.: 17/391,138

(22) Filed: Aug. 2, 2021

(65) Prior Publication Data

US 2022/0139803 A1 May 5, 2022

(30) Foreign Application Priority Data

Nov. 4, 2020 (JP) .............................. JP2020-184105

(51) Int. Cl.
| | |
|---|---|
| *H01L 23/433* | (2006.01) |
| *H01L 23/31* | (2006.01) |
| *H01L 23/492* | (2006.01) |
| *H01L 23/00* | (2006.01) |
| *H01L 23/49* | (2006.01) |

(52) U.S. Cl.
CPC ........ *H01L 23/433* (2013.01); *H01L 23/3121* (2013.01); *H01L 23/49* (2013.01); *H01L 23/492* (2013.01); *H01L 24/48* (2013.01); *H01L 24/73* (2013.01); *H01L 2224/48151* (2013.01); *H01L 2224/73265* (2013.01)

(58) Field of Classification Search
CPC ....................................................... H01L 23/433
USPC ........................................................... 257/675
See application file for complete search history.

(56) References Cited

U.S. PATENT DOCUMENTS

| | | | | |
|---|---|---|---|---|
| 2012/0250323 A1* | 10/2012 | Velu | ......................... | F21V 29/70 |
| | | | | 257/E33.056 |
| 2018/0160569 A1 | 6/2018 | Yoshihara | | |
| 2019/0157010 A1* | 5/2019 | Ando | ..................... | H01G 4/224 |

FOREIGN PATENT DOCUMENTS

| | | | |
|---|---|---|---|
| JP | 5306171 B2 | 10/2013 | |
| JP | 6707328 B2 | 6/2020 | |

* cited by examiner

*Primary Examiner* — Ajay Arora
(74) *Attorney, Agent, or Firm* — Sughrue Mion, PLLC; Richard C. Turner

(57) ABSTRACT

In this semiconductor device, a positioning protrusion is formed at a side surface of a sealing resin from which one end of a main electrode wire protrudes. Thus, the outer size of the sealing resin can be reduced as compared to a case where a positioning protrusion is formed at the bottom of the sealing resin. In addition, a thickness regulating protrusion is provided with a space from solder. Thus, it is possible to prevent interface separation or crack that would occur starting from a contact part between the thickness regulating protrusion and the solder, whereby the life of a joining part between a semiconductor module and a cooler can be ensured. Accordingly, a semiconductor device having enhanced heat dissipation property and reliability is obtained without increase in the outer size of the semiconductor module.

20 Claims, 4 Drawing Sheets

SEMICONDUCTOR DEVICE WITH A METAL PLATE

BACKGROUND OF THE INVENTION

1. Field of the Invention

The present disclosure relates to a semiconductor device.

2. Description of the Background Art

In recent years, semiconductor elements have been increased in output and reduced in size, and a semiconductor device including a cooler and a semiconductor module on which such semiconductor elements are mounted is required to have higher heat dissipation property than conventional ones. However, heat dissipation grease widely used as a joining material between the semiconductor module and the cooler has low thermal conductivity, and therefore there is a concern that heat dissipation property is reduced due to aging.

Accordingly, using solder having higher thermal conductivity than the heat dissipation grease as the joining material can improve heat dissipation property. Meanwhile, if joining is made with the solder having an uneven thickness in a solder reflow process, interface separation or crack can occur due to insufficiency of the adhesion strength during heat cycles, leading to decrease in the product life.

In a conventional semiconductor device, protrusions are provided to the semiconductor module or the cooler, thereby managing the thickness of the joining material. For example, in a power module disclosed in Patent Document 1, regulating portions for regulating the thickness of a heat-conductive material are provided to a surface of a sealing body on a side joined to the cooler, and positioning protrusions are provided so as to penetrate through the centers of the regulating portions.

Patent Document 1: Japanese Patent No. 6707328

In order to ensure heat dissipation property and reliability of the semiconductor device, it is important to prevent occurrence of interface separation or crack of a joining material at a joining part between the semiconductor module and the cooler and thus ensure the life of the joining part. For that purpose, the thickness of solder between the semiconductor module and the cooler needs to be uniform.

However, as in Patent Document 1, in the case where the positioning protrusions penetrating through the centers of the thickness regulating portions are provided on the back surface side of the sealing body, it is necessary to increase the outer size of the sealing body, thus having a problem that the size of the semiconductor module increases.

SUMMARY OF THE INVENTION

The present disclosure has been made to solve the above problem, and an object of the present disclosure is to obtain a semiconductor device having enhanced heat dissipation property and reliability without increasing the outer size of a semiconductor module.

A semiconductor device according to one aspect of the present disclosure includes a semiconductor module, the semiconductor module including: a semiconductor element mounted at one surface of a metal member; a metal plate provided at another surface of the metal member with an insulation sheet interposed therebetween; a main electrode wire connected to the semiconductor element or the metal member; and a sealing resin sealing the semiconductor element, the metal member, the insulation sheet, and the metal plate, with one surface of the metal plate exposed. The metal plate exposed from a bottom of the sealing resin and a cooling surface of a cooler are joined to each other via solder. One end of the main electrode wire protrudes from a side surface of the sealing resin. A positioning protrusion for positioning the semiconductor module and the cooler is formed at the side surface of the sealing resin from which the main electrode wire protrudes. A thickness regulating protrusion keeping a distance between the cooling surface and the semiconductor module constant and regulating a thickness of the solder is formed at the side surface or the bottom of the sealing resin.

A semiconductor device according to another aspect of the present disclosure includes a semiconductor module, the semiconductor module including: a semiconductor element mounted at one surface of a metal member; a metal plate provided at another surface of the metal member with an insulation sheet interposed therebetween; a main electrode wire connected to the semiconductor element or the metal member; and a sealing resin sealing the semiconductor element, the metal member, the insulation sheet, and the metal plate, with one surface of the metal plate exposed. The metal plate exposed from a bottom of the sealing resin and a cooling surface of a cooler are joined to each other via solder. One end of the main electrode wire protrudes from a side surface of the sealing resin. A positioning protrusion for positioning the semiconductor module and the cooler is formed at the side surface of the sealing resin from which the main electrode wire protrudes. The positioning protrusion also serves as a thickness regulating protrusion keeping a distance between the cooling surface and the semiconductor module constant and regulating a thickness of the solder.

In the semiconductor device according to the present disclosure, since the positioning protrusion is formed at the side surface of the sealing resin from which the main electrode wire protrudes, the outer size of the sealing resin can be reduced as compared to a case where the positioning protrusion is formed at the bottom of the sealing resin. In addition, since the thickness of the solder can be made uniform by the thickness regulating protrusion, interface separation or crack of the solder can be prevented, whereby the life of the joining part between the semiconductor module and the cooler can be ensured. Thus, it is possible to obtain the semiconductor device having enhanced heat dissipation property and reliability without increasing the outer size of the semiconductor module.

In addition, since the positioning protrusion also serving as the thickness regulating protrusion regulating the thickness of the solder is formed at the side surface of the sealing resin from which the main electrode wire protrudes, the outer size of the sealing resin can be reduced as compared to a case where the positioning protrusion is formed at the bottom of the sealing resin. In addition, since the thickness of the solder can be made uniform by the positioning protrusion also serving as the thickness regulating protrusion, interface separation or crack of the solder can be prevented, whereby the life of the joining part between the semiconductor module and the cooler can be ensured. Thus, it is possible to obtain the semiconductor device having enhanced heat dissipation property and reliability without increasing the outer size of the semiconductor module.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

First Embodiment

Figure 1:
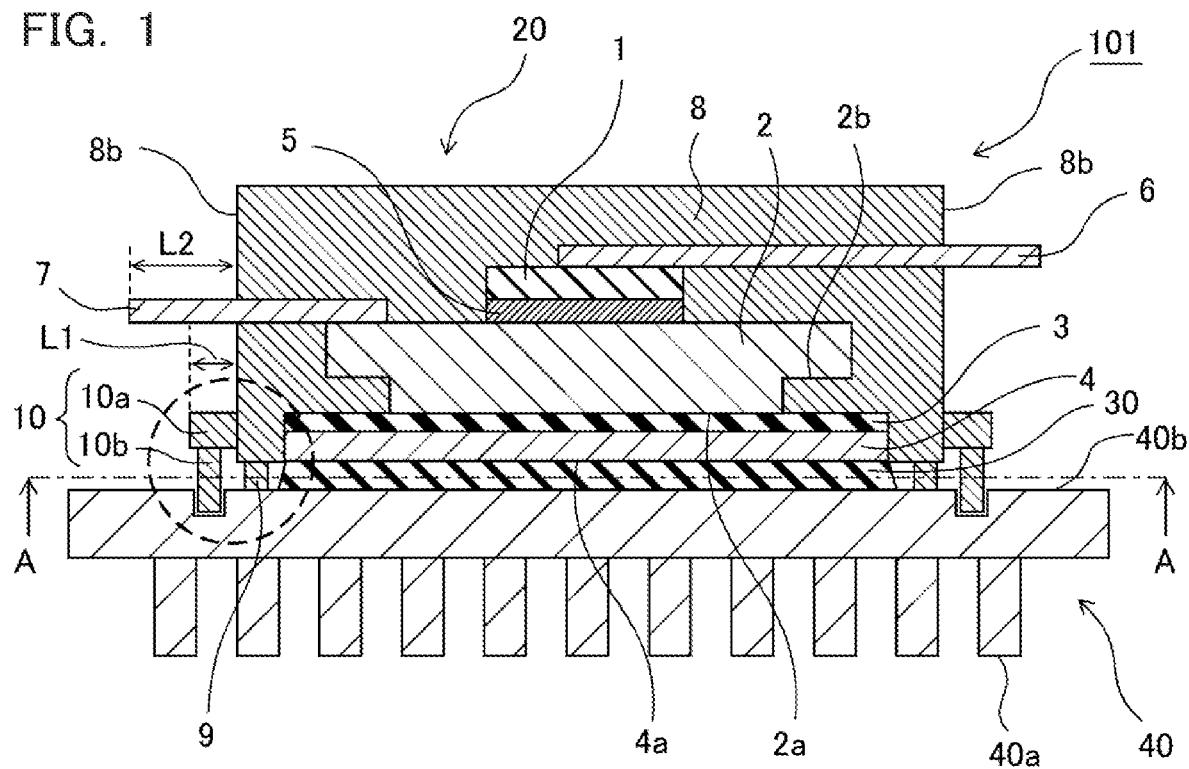
FIG. 1 is a side sectional view showing the schematic structure of a semiconductor device according to the first embodiment of the present disclosure.
Figure 2:
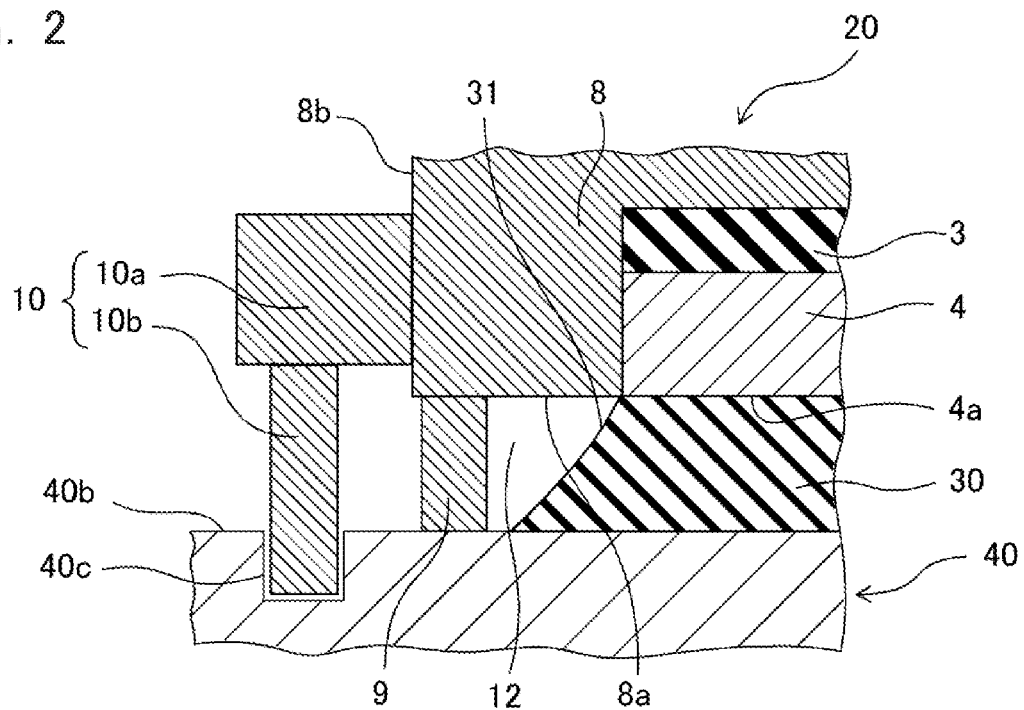
FIG. 2 is a partially enlarged sectional view illustrating a thickness regulating protrusion and a positioning protrusion of the semiconductor device according to the first embodiment.
Figure 3:
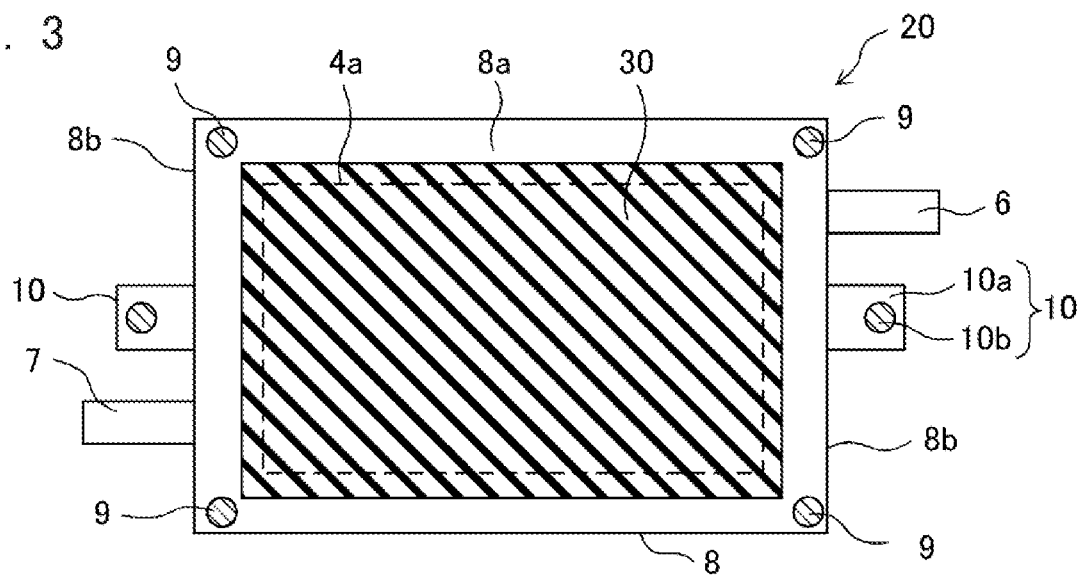
FIG. 3 is a sectional view illustrating the thickness regulating protrusions and the positioning protrusions of the semiconductor device according to the first embodiment.

Hereinafter, a semiconductor device according to the first embodiment of the present disclosure will be described with reference to the drawings. FIG. 1 is a side sectional view showing the schematic structure of the semiconductor device according to the first embodiment, and FIG. 2 and FIG. 3 illustrate a thickness regulating protrusion and a positioning protrusion of the semiconductor device according to the first embodiment. FIG. 2 is a partially enlarged sectional view of a part indicated by a dotted-line circle in FIG. 1, and FIG. 3 is a sectional view of a part in a joining area indicated by line A-A as seen from the arrow direction in FIG. 1. In the drawings, the same or corresponding parts are denoted by the same reference characters.

A semiconductor device 101 according to the first embodiment includes a semiconductor module 20 and a cooler 40 as basic constituent parts. The semiconductor module 20 includes a semiconductor element 1 mounted at one surface of a metal member 2, a metal plate 4 provided at the other surface (hereinafter, back surface 2a) of the metal member 2 with an insulation sheet 3 interposed therebetween, and a sealing resin 8 sealing the semiconductor element 1, the metal member 2, the insulation sheet 3, and the metal plate 4, with one surface (hereinafter, back surface 4a) of the metal plate 4 exposed.

The back surface 4a of the metal plate 4 exposed from a bottom 8a of the sealing resin 8 is joined to a cooling surface 40b of the cooler 40 via solder 30. Main electrode wires 6, 7 are respectively connected to the semiconductor element 1 and the metal member 2, and one end of each main electrode wire 6, 7 respectively protrudes from two opposite side surfaces 8b of the sealing resin 8.

At the side surfaces 8b of the sealing resin 8 from which the main electrode wires 6, 7 protrude, i.e., at the side surface 8b where the main electrode wires 6, 7 are provided, positioning protrusions 10 are formed for positioning the semiconductor module 20 and the cooler 40. At the bottom 8a of the sealing resin 8, thickness regulating protrusions 9 are formed for keeping the distance between the cooling surface 40b and the semiconductor module 20 constant and regulating the thickness of the solder 30.

Components constituting the semiconductor device 101 will be described. The semiconductor element 1 is an element for power control, and is, for example, a switching element such as a metal-oxide-semiconductor field effect transistor (MOSFET), an insulated gate bipolar transistor (IGBT), or a reverse conducting insulated gate bipolar transistor (RC-IGBT), or a rectification element such as a flyback diode, using silicon (Si) as a material.

Instead of silicon, a wide bandgap semiconductor made of silicon carbide (SiC), gallium nitride (GaN), or the like may be used. The semiconductor module 20 may have at least one semiconductor element.

The metal member 2 on which the semiconductor element 1 is mounted serves as an electrode and as a heat spreader. The main electrode wires 6, 7 are respectively connected to the semiconductor element 1 and the metal member 2 via joining materials or metal wires (either not shown). A control electrode (not shown) of the semiconductor element 1 is connected to an external electrode via a metal wire (not shown). In the first embodiment, one end of the main electrode wire 6 connected to the semiconductor element 1 and one end of the main electrode wire 7 connected to the metal member 2 protrude from the two opposite side surfaces 8b of the sealing resin 8.

The metal member 2 and the semiconductor element 1 are joined to each other via a metal sintered body 5 or solder. In a case of using solder, for example, solder such as Sn—Ag—Cu-based, Sn—Cu-based, Sn—Ag-based, or Sn—Sb-based material is used. Au, Ag, and Cu used for the metal sintered body 5 have higher thermal conductivity and allow reduction in the joining thickness, as compared to solder. Thus, it is possible to enhance heat dissipation property by using the metal sintered body 5 or solder.

It is preferable that the materials of the metal member 2 and the main electrode wires 6, 7 are high in thermal conductivity and electric conductivity. For example, copper (Cu), aluminum (Al), iron (Fe), an alloy thereof, or a material obtained by plating the surface of the above material with nickel (Ni) or the like, may be used. In particular, copper which is excellent in thermal conductivity and electric conductivity is preferable. It is noted that the materials of the metal member 2 and the main electrode wires 6, 7 are not limited to the above ones.

The metal member 2 may have various shapes in accordance with the purpose, and for example, may have a side surface in an inverted taper shape. That is, if the surface on which the semiconductor element 1 is mounted has a larger shape than the back surface 2a, adhesion with the sealing resin 8 can be improved owing to an anchor effect. Thus, it is possible to suppress interface separation and crack at the interface between the sealing resin 8 and the metal member 2 and the interface between the insulation sheet 3 and the metal member 2 during heat cycles.

As shown in FIG. 1, a step 2b, a cutout, or the like may be formed at a side surface of the metal member 2. Thus, in addition to an anchor effect, the insulation creeping distance of the sealing resin 8 from the metal member 2 to an end of the metal plate 4 is increased, whereby insulation property is improved. This can contribute to size reduction in the semiconductor module 20 in a case where ensuring the insulation creeping distance poses constraints on the size of the semiconductor module 20.

As the metal member 2, a metal lead frame may be used. The metal lead frame can be manufactured in a desired shape by press work, and if the metal member 2 is formed integrally with the main electrode wire 7 and a control terminal (not shown) or the like, the number of components can be decreased. In addition, a thickness varying material may be used so that the thickness at the part where the semiconductor element 1 is mounted and around this part is greater than the thickness at the parts where the main electrode wire 7 and the like are present. In this case, heat dissipation property is improved as compared to a case where the thickness of the metal lead frame is constant.

The semiconductor module 20 may have a plurality of metal members 2. For example, the semiconductor module 20 may have two metal members having different potentials, on which the semiconductor elements 1 are mounted, so as to form a half-bridge circuit in the semiconductor module 20, thus forming a so-called 2-in-1 module or the like.

In a case of a three-phase inverter, the semiconductor elements 1 are connected in series one by one or sets of several semiconductor elements 1 connected in parallel are connected in series, to form upper and lower arms, and the upper and lower arms form each phase (U phase, V phase, W phase) of a full-bridge circuit. In the case of a 2-in-1 module, the upper and lower arms for one phase are formed by one semiconductor module 20. It is noted that the semiconductor module 20 in the first embodiment is not limited to a three-phase inverter, and may be applied to various types of power conversion devices.

The insulation sheet 3 is a sheet material having electric insulation property and excellent heat dissipation property, and a material having high thermal conductivity is used for the insulation sheet 3 in order to improve heat dissipation property. Specifically, a material obtained by containing a filler having high thermal conductivity, e.g., a ceramic filler, in epoxy resin is used. It is noted that the material of the insulation sheet 3 is not limited thereto.

The insulation sheet 3 has a shape and an area corresponding to the back surface 2a of the metal member 2, and preferably, is larger than the back surface 2a of the metal member 2, as shown in FIG. 1. The optimum area and thickness of the insulation sheet 3 are determined in consideration of heat dissipation property and insulation property. In the first embodiment, the insulation sheet 3 is formed integrally with the metal plate 4 which is a metal sheet material, and these are mechanically and thermally connected to each other. As the material of the metal plate 4, a high-thermal-conductive material such as copper, aluminum, iron, an alloy thereof, or a material obtained by plating the surface of the above material with chromium (Cr) or the like, is used, and copper which has particularly high thermal conductivity is preferable.

In terms of heat dissipation property, it is preferable that the area in the horizontal direction of the metal plate 4 is larger than that of the metal member 2. In the example shown in FIG. 1, the metal plate 4 is a block having a rectangular parallelepiped shape, but may have various shapes in accordance with the purpose. For example, the metal plate 4 may have a side surface in an inverted taper shape. That is, a surface thereof connected to the insulation sheet 3 may be larger than the back surface 4a.

The shape of a side surface of the metal plate 4 may be a "dogleg" shape in which the center part protrudes. Such a shape improves adhesion with the sealing resin 8 by an anchor effect. Thus, it is possible to suppress interface separation and crack at the interface between the sealing resin 8 and the metal plate 4 and the interface between the insulation sheet 3 and the metal plate 4 during heat cycles.

The sealing resin 8 has the bottom 8a from which the back surface 4a of the metal plate 4 is exposed, and side surfaces substantially perpendicular to the bottom 8a. In the first embodiment, the sealing resin 8 is formed substantially in a rectangular parallelepiped shape, and has four side surfaces perpendicular to the bottom 8a. It is noted that the outer shape of the sealing resin 8 is not limited thereto.

The sealing resin 8 is a thermosetting resin such as epoxy resin or silicon resin having insulation property, and the linear expansion coefficient and the elastic modulus thereof are adjusted by mixing a filler therein. Epoxy resin containing, for example, silica particles as a filler may be used, and if the insulation sheet 3 is also made of epoxy resin containing such a filler, both epoxy resins react with each other and thus a great adhesion strength is obtained.

The amount of the filler to be contained in the sealing resin 8 is determined in consideration of the linear expansion coefficients of members used in the semiconductor device 101. For example, in a case where copper is used for the metal member 2 and the metal plate 4, it is preferable that the linear expansion coefficient of the sealing resin 8 is 15 ppm/K to 19 ppm/K in accordance with that of copper. Thus, the semiconductor module 20 with no warp is obtained. In addition, it is possible to suppress interface separation and crack at the interface between the sealing resin 8 and the metal member 2 and the interface between the sealing resin 8 and the metal plate 4 during heat cycles.

The cooler 40 has a plurality of heat dissipation fins 40a for dissipating heat generated in the semiconductor element 1. In the case of using the solder 30 in the joining area between the semiconductor module 20 and the cooler 40, the thermal conductivity becomes ten or more times greater than in a case of using heat dissipation grease, and thus heat dissipation property of the semiconductor device 101 is improved.

The material of the cooler 40 is selected from copper, a copper alloy, aluminum, an aluminum alloy, and the like. Among these, aluminum or an alloy thereof, which is low in weight and cost and excellent in workability, is preferable, and a material obtained by plating aluminum with nickel, copper, tin (Sn), or the like may be used.

The cooler 40 is manufactured by die casting, extrusion, or the like. An aluminum alloy suitable for die casting, extrusion, or the like is, for example, ADC10 or ADC12 which is an Al—Si—Cu-based material, or A6061 or A6063 which is an Al—Mg—Si-based material. However, the material, the shape, and the like of the cooler 40 are not particularly limited as long as the cooler 40 can be mechanically and thermally connected to the metal plate 4 via the solder 30.

As the solder 30, for example, a solder material such as Sn—Ag—Cu-based, Sn—Cu-based, Sn—Ag-based, or Sn—Sb-based material is used. In the example shown in FIG. 1, the semiconductor element 1 and the main electrode wire 6 are joined to each other via second solder (not shown). As the second solder, a material having a higher melting point than the solder 30 joining the semiconductor module 20 and the cooler 40 is selected. Thus, it is possible to prevent a failure in which, when the semiconductor module 20 and the cooler 40 are joined to each other via the solder 30, the second solder is melted and expands in volume and thereby the semiconductor module 20 is damaged inside.

The thickness regulating protrusions 9 are formed at the bottom 8a of the sealing resin 8, and keep the distance between the semiconductor module 20 and the cooler 40 constant and regulate the thickness of the solder 30 in the joining area so as to be uniform. The protrusion lengths of the thickness regulating protrusions 9 from the bottom 8a of the sealing resin 8 are equal to a required solder thickness. The solder 30 is joined to the entire back surface 4a of the metal plate 4 exposed from the bottom 8a of the sealing resin 8.

The thickness regulating protrusions 9 need to be formed in at least three locations on the bottom 8a of the sealing resin 8, in order to keep the distance between the semiconductor module 20 and the cooler 40 constant. In the first embodiment, as shown in FIG. 3, the thickness regulating protrusions 9 having a columnar shape are formed near four corners of the bottom 8a. Thus, the thickness of the solder 30 can be regulated to be constant, and the semiconductor module 20 is attached to the cooler 40 without being tilted.

Each thickness regulating protrusion 9 is provided with a space 12 from the solder 30, as shown in FIG. 2. At an end of the solder 30, a fillet 31 is formed with its base spreading from the metal plate 4 to the cooler 40 side. The distance (indicated by L3 in FIG. 5) from the side surface of the metal plate 4 to the side surface of the sealing resin 8, the distance from the side surface of the metal plate 4 to the thickness regulating protrusion 9, the thickness of the solder 30, the solder amount, and the like are designed so that the fillet 31 does not come into contact with the thickness regulating protrusion 9.

For example, at the time of solder reflow, if joining is made in a state in which the thickness regulating protrusion 9 and the solder 30 are in contact with each other, stress concentrates on the contact part during heat cycles. Thus, at the interface between the sealing resin 8 and the solder 30 and the interface between the sealing resin 8 and the metal plate 4, interface separation or crack is likely to occur starting from the above contact part. In particular, as the contact part becomes closer to the sealing resin 8, the start point where stress concentrates becomes closer and thus interface separation or crack becomes more likely to occur.

Providing the thickness regulating protrusions 9 to the sealing resin 8 suppresses deformation of the semiconductor module 20, whereby expansion and contraction of the solder 30 can be suppressed. Thus, stress occurring in the solder 30 at the time of solder reflow or heat shock can be reduced. In particular, providing the thickness regulating protrusions 9 near four corners of the sealing resin 8 can effectively reduce the stress.

Further, in the case where the thickness regulating protrusions 9 are provided to the sealing resin 8, as compared to a case where the thickness regulating protrusions 9 are provided to the metal plate 4, the area where solder joining can be made is not restricted, and the solder 30 can be joined to the entire back surface 4a of the metal plate 4. Thus, as compared to the case where solder joining is made on the inner side excluding the end part of the metal plate 4, a heat transfer area where heat generated in the semiconductor element 1 is dissipated becomes larger, so that heat dissipation property of the semiconductor device 101 is improved.

Thus, the sizes of components of the semiconductor module 20 can be reduced, leading to size reduction of the semiconductor module 20. In addition, since the area of the solder joining range is increased, the joining strength between the semiconductor module 20 and the cooler 40 is enhanced and thus reliability is improved.

As shown in FIG. 1 and FIG. 3, at least one positioning protrusion 10 is formed at each of the two opposite side surfaces 8b of the sealing resin 8 from which one end of each main electrode wire 6, 7 respectively protrudes. In order to prevent position displacement and enhance positioning accuracy, the positioning protrusions 10 are preferably provided in at least two locations, and the distance therebetween is preferably away from each other.

As shown in FIG. 2, the positioning protrusion 10 in the first embodiment has a side surface protrusion 10a protruding perpendicularly from the side surface 8b of the sealing resin 8, and a distal end protrusion 10b protruding toward the cooler 40 from one surface of the side surface protrusion 10a. In the cooling surface 40b of the cooler 40, a recess 40c corresponding to the distal end protrusion 10b is formed, and the distal end protrusion 10b is inserted into the recess 40c. Thus, the semiconductor module 20 is positioned with respect to the cooler 40, whereby position displacement in the horizontal direction can be prevented at the time of attachment of the semiconductor module 20, solder reflow, or the like.

The protrusion length (indicated by L1 in FIG. 1) of the side surface protrusion 10a from the sealing resin 8 is set to be not greater than the protrusion length (indicated by L2 in FIG. 1) of the main electrode wire 7 (or main electrode wire 6) from the sealing resin 8 (L1 L2). Thus, positioning can be made without increasing the size of the semiconductor module 20 because of the positioning protrusion 10.

As a comparative example, in a case where the positioning protrusions 10 are provided on side surfaces different from the side surfaces 8b from which the main electrode wires 6, 7 protrude, or in a case where the protrusion length L1 of the positioning protrusions 10 is greater than the protrusion length L2 of the main electrode wires 6, 7 (L1>L2), the size of the semiconductor module 20 increases, and therefore such a configuration is not preferable.

In the first embodiment, the distal end protrusion 10b is formed in a columnar shape, and the recess 40c of the cooler 40 is formed in a cylindrical shape. Here, in the case where positioning is made with a plurality of positioning protrusions 10, some of the plurality of recesses 40c may be formed as elongated holes so as to provide clearances from the outer circumferences of the distal end protrusions 10b. Thus, it is possible to cope with dimension change due to thermal expansion at the time of solder reflow or variation in the dimensions due to manufacturing error.

Figure 4A:
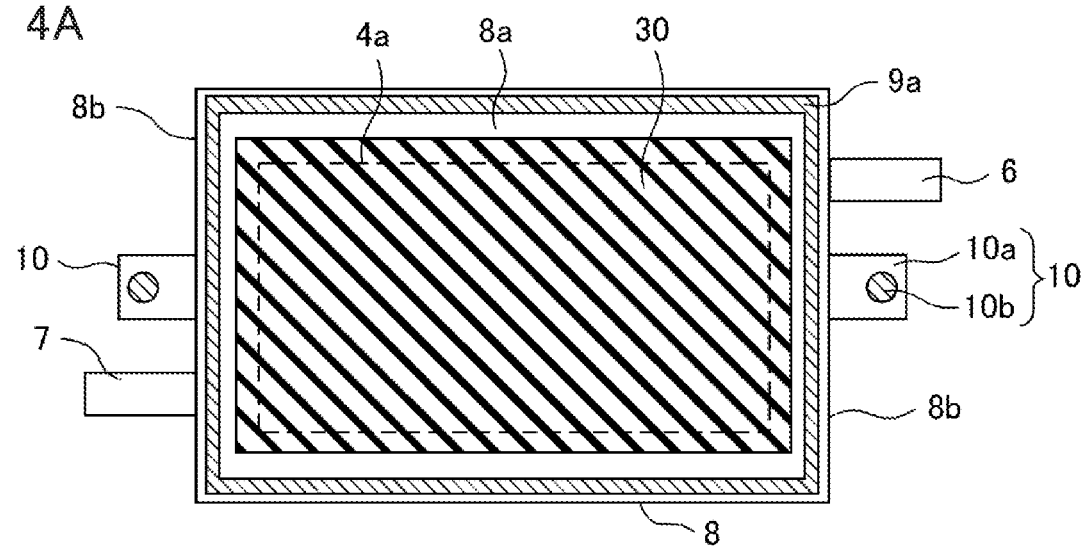
FIGS. 4A and 4B are sectional views showing modifications of the thickness regulating protrusions and the positioning protrusions of the semiconductor device according to the first embodiment.
Figure 4B:
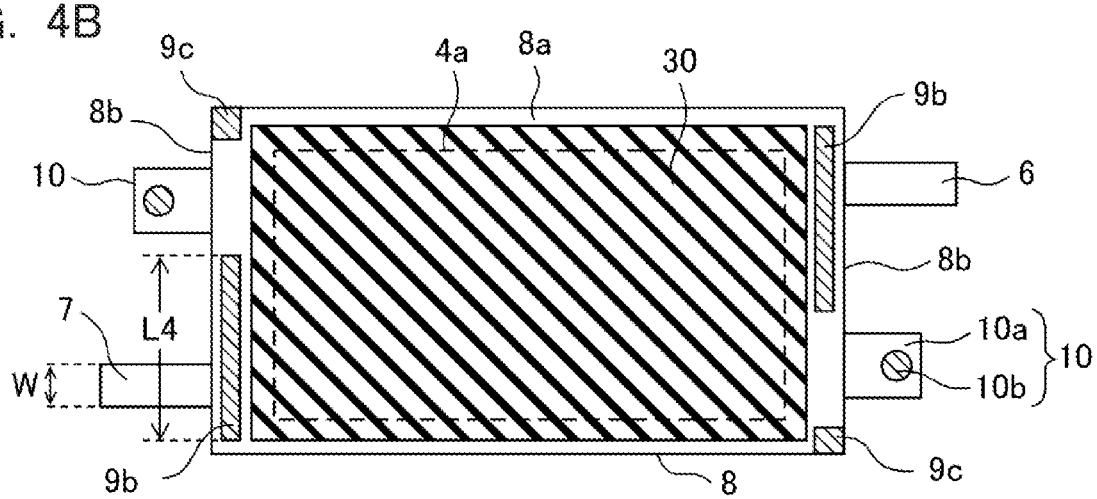

Modifications of the thickness regulating protrusions 9 and the positioning protrusions 10 in the first embodiment will be described with reference to FIGS. 4A and 4B. FIGS. 4A and 4B are sectional views of a part in a joining area indicated by line A-A as seen from the arrow direction in FIG. 1. In the modification shown in FIG. 4A, a thickness regulating protrusion 9a is formed at a peripheral part of the bottom 8a of the sealing resin 8. In addition, two positioning protrusions 10 are formed at the side surfaces 8b where the main electrode wires 6, 7 are located.

In this modification, since the thickness regulating protrusion 9a is provided at the peripheral part of the bottom 8a, deformation of the semiconductor module 20 can be more firmly suppressed. In addition, the insulation creeping distance of the sealing resin 8 from the main electrode wires 6, 7 to an end of the metal plate 4 is increased, whereby insulation property is improved. This can contribute to size reduction in the semiconductor module 20 in a case where ensuring the insulation creeping distance poses constraints on the size of the semiconductor module 20. However, since the contact area between the thickness regulating protrusion 9a and the cooler 40 increases, flatness management for the semiconductor module 20 becomes more important.

In the modification shown in FIG. 4B, thickness regulating protrusions 9b are formed with lengths L4 not less than widths W of the main electrode wires 6, 7, at locations corresponding to the main electrode wires 6, 7 on the bottom 8a of the sealing resin 8. In addition, thickness regulating protrusions 9c having a prism shape are formed at corners where the thickness regulating protrusions 9b are not formed. Thus, the thickness regulating protrusions 9b, 9c are provided at four locations on the bottom 8a. The positioning protrusions 10 are formed at the side surfaces 8b where the main electrode wires 6, 7 are located, so as to correspond to locations where the thickness regulating protrusions 9b, 9c are not formed.

In this modification, owing to the thickness regulating protrusions 9b formed with lengths not less than the widths of the main electrode wires 6, 7, the insulation creeping distance of the sealing resin 8 from each main electrode wire 6, 7 to an end of the metal plate 4 is increased, so that insulation property is improved. In addition, flatness management for the semiconductor module 20 is easier than in the example shown in FIG. 4A. Further, since thickness regulating members are not provided on the bottom 8a at parts adjacent to the side surfaces of the sealing resin 8 where the main electrode wires 6, 7 are not located, the outer size of the sealing resin 8 can be reduced.

The shapes, the numbers, and the locations of the thickness regulating protrusions 9 and the positioning protrusions 10 are not limited to the above examples. For example, the distal end protrusion 10b of the positioning protrusion 10 may be a prism shape, and the recess 40c may be a polygonal hole or an elongated hole. The thickness regulating protrusions 9 may be provided on the side surfaces 8b of the sealing resin 8 (see FIG. 8B).

As described above, in the semiconductor device 101 according to the first embodiment, since the positioning protrusions 10 are formed at the side surfaces 8b of the sealing resin 8 from which the main electrode wires 6, 7 protrude, the outer size of the sealing resin 8 can be reduced as compared to a case where positioning protrusions are formed at the bottom 8a of the sealing resin 8.

In addition, the thickness of the solder 30 can be made uniform by the thickness regulating protrusions 9, and thus interface separation or crack of the solder 30 can be prevented. Further, since the thickness regulating protrusions 9 are provided with the spaces 12 from the solder 30, interface separation or crack that would occur starting from the contact part between the thickness regulating protrusion 9 and the solder 30 can be prevented, and thus the life of the joining part between the semiconductor module 20 and the cooler 40 can be ensured.

In addition, owing to the thickness regulating protrusions 9 provided to the sealing resin 8, deformation of the semiconductor module 20 is suppressed, whereby expansion and contraction of the solder 30 can be suppressed. Thus, stress occurring in the solder 30 at the time of solder reflow or heat shock can be reduced, whereby a highly reliable joining part is obtained. In addition, since solder joining is made on the entire back surface 4a of the metal plate 4, the heat transfer area is increased as compared to a case where solder joining is made on the inner side of the metal plate 4, and thus heat dissipation property is improved.

From the above, according to the first embodiment, it is possible to obtain the semiconductor device 101 having enhanced heat dissipation property and reliability without increasing the outer size of the semiconductor module 20. In addition, as a result of improvement in heat dissipation property, product size reduction, energy saving, and package size reduction can be achieved, and improvement in reliability contributes to extension of the product life.

In a case of using SiC for the semiconductor element 1, there is an advantage that operation can be performed at a higher temperature than in a case of Si, but meanwhile, higher reliability is required for the semiconductor device. Therefore, the semiconductor device 101 according to the first embodiment, when being applied to a semiconductor device on which an SiC device is mounted, greatly contributes to achievement of a highly reliable semiconductor device.

Second Embodiment

Figure 5:
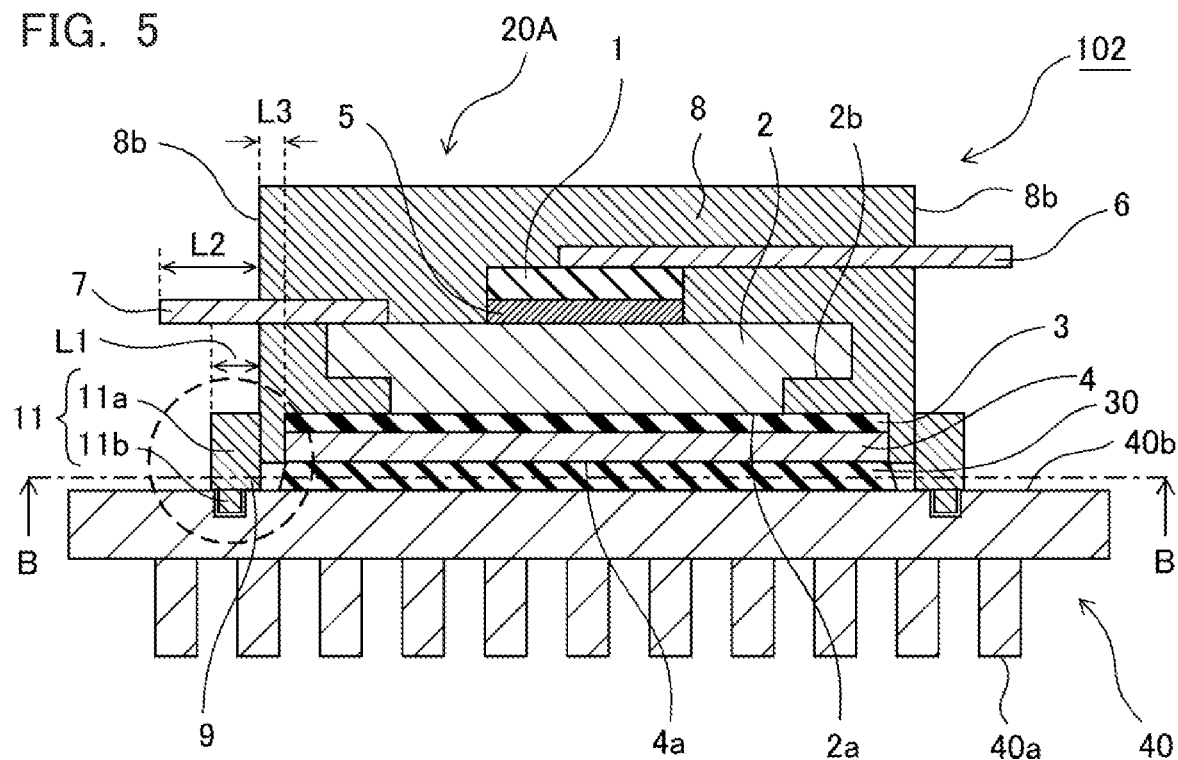
FIG. 5 is a side sectional view showing the schematic structure of a semiconductor device according to the second embodiment of the present disclosure.
Figure 6:
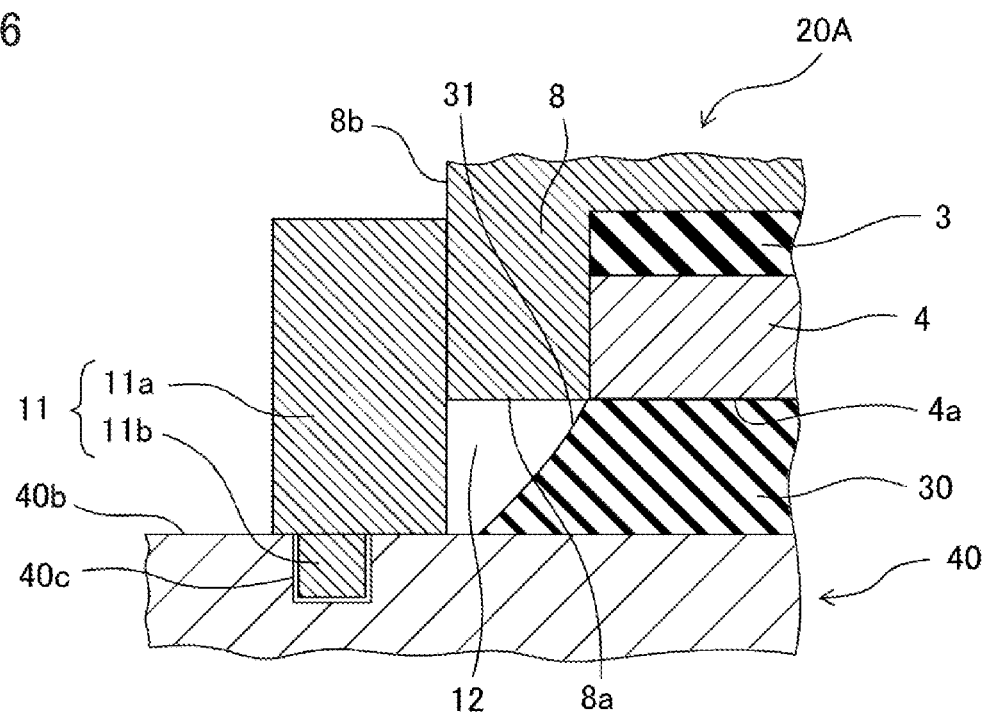
FIG. 6 is a partially enlarged sectional view illustrating a thickness-regulating and positioning protrusion of the semiconductor device according to the second embodiment.
Figure 7:
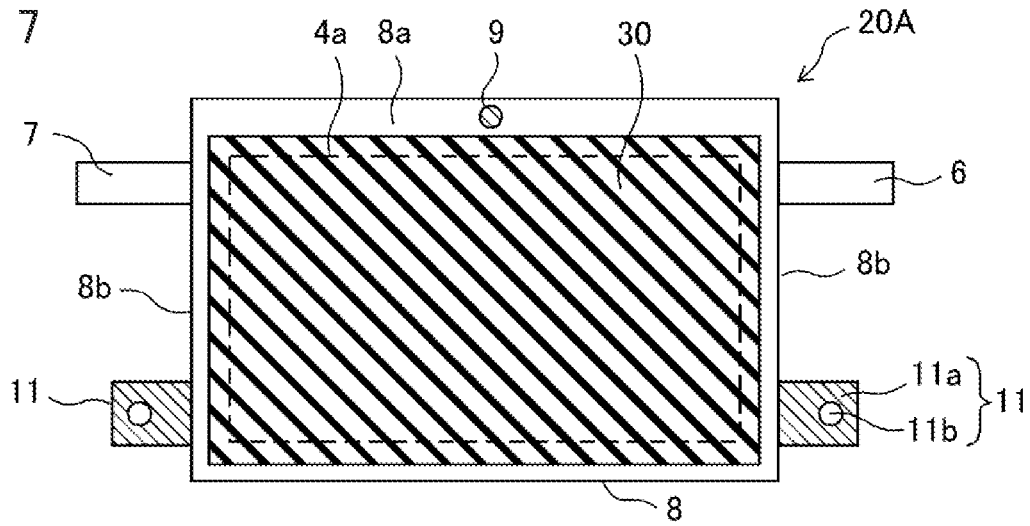
FIG. 7 is a sectional view illustrating the thickness-regulating and positioning protrusions of the semiconductor device according to the second embodiment.

FIG. 5 is a side sectional view showing the schematic structure of a semiconductor device according to the second embodiment of the present disclosure, and FIG. 6 and FIG. 7 illustrate a thickness-regulating and positioning protrusion of the semiconductor device according to the second embodiment. FIG. 6 is a partially enlarged sectional view of a part indicated by a dotted-line circle in FIG. 5, and FIG. 7 is a sectional view of a part in a joining area indicated by line B-B as seen from the arrow direction in FIG. 5.

A semiconductor device 102 according to the second embodiment includes a semiconductor module 20A and the cooler 40, and the semiconductor module 20A and the cooler 40 are joined to each other via the solder 30. In the semiconductor module 20A, positioning protrusions for positioning the semiconductor module 20A and the cooler 40 are formed at the side surfaces 8b of the sealing resin 8 from which the main electrode wires 6, 7 protrude, and the positioning protrusions also serve as thickness regulating protrusions for keeping the distance between the cooling surface 40b and the semiconductor module 20A constant and regulating the thickness of the solder 30. The other configurations of the semiconductor device 102 according to the second embodiment are the same as in the first embodiment, and therefore the description thereof is omitted here.

The positioning protrusion also serving as the thickness regulating protrusion in the second embodiment (hereinafter, referred to as thickness-regulating and positioning protrusion 11) has a side surface protrusion 11a protruding perpendicularly from the side surface 8b of the sealing resin 8, and a distal end protrusion 11b protruding toward the cooler 40 from one surface of the side surface protrusion 11a. As shown in FIG. 6, a recess 40c corresponding to the distal end protrusion 11b is formed in the cooling surface 40b of the cooler 40. The distal end protrusion 11b is inserted into the recess 40c of the cooler 40, whereby the semiconductor module 20A is positioned with respect to the cooler 40.

In addition, the side surface protrusion 11a of the thickness-regulating and positioning protrusion 11 is in contact with the cooling surface 40b of the cooler 40, thereby keeping the distance between the cooling surface 40b and the semiconductor module 20A constant. That is, the thickness-regulating and positioning protrusion 11 regulates the thickness of the solder 30 to be constant by the side surface protrusion 11a.

As shown in FIG. 6, the thickness-regulating and positioning protrusion 11 is provided with the space 12 from the solder 30. The distance (indicated by L3 in FIG. 5) from the side surface of the metal plate 4 to the side surface of the sealing resin 8, the distance from the side surface of the metal plate 4 to the side surface protrusion 11a, the thickness of the solder 30, the solder amount, and the like are designed so that the thickness regulating protrusion 9 does not come into contact with the fillet 31. In addition, the protrusion length L1 of the side surface protrusion 11a from the sealing resin 8 is set to be not greater than the protrusion length L2 of the main electrode wire 6 (or main electrode wire 7) from the sealing resin 8 (L1 L2).

As described above, the thickness regulating protrusions need to be formed in at least three locations, and the positioning protrusions need to be formed in at least two locations. Therefore, separately from the thickness-regulating and positioning protrusions 11, a thickness regulating protrusion for keeping the distance between the cooling surface 40b and the semiconductor module 20A constant and regulating the thickness of the solder 30 may be formed at the side surface 8b or the bottom 8a of the sealing resin 8.

In the second embodiment, as shown in FIG. 7, the thickness-regulating and positioning protrusions 11 are respectively provided on the two side surfaces 8b where the main electrode wires 6, 7 are located, and the same thickness regulating protrusion 9 as in the first embodiment is provided on the bottom 8a at a part adjacent to a side surface where the main electrode wires 6, 7 are not located.

Thus, the semiconductor module 20A has three thickness regulating protrusions and two positioning protrusions, whereby the number of the thickness regulating protrusions 9 provided to the bottom 8a of the sealing resin 8 can be minimized. In addition, as compared to a case where positioning protrusions are provided on the bottom 8a of the sealing resin 8, the distance L3 from the side surface of the metal plate 4 to the side surface of the sealing resin 8 can be shortened, whereby the size of the semiconductor module 20A can be reduced.

Figure 8A:
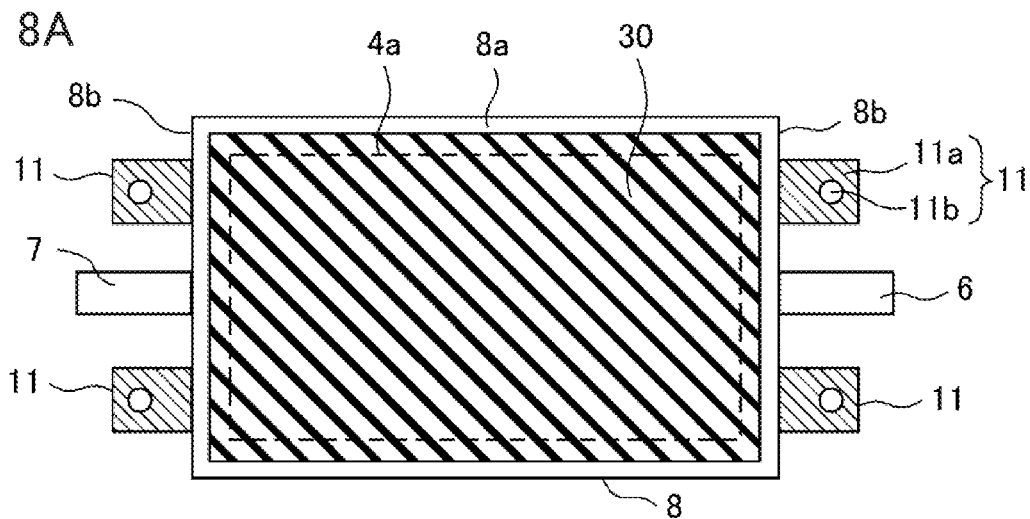
FIGS. 8A and 8B are sectional views showing modifications of the thickness-regulating and positioning protrusions of the semiconductor device according to the second embodiment.
Figure 8B:
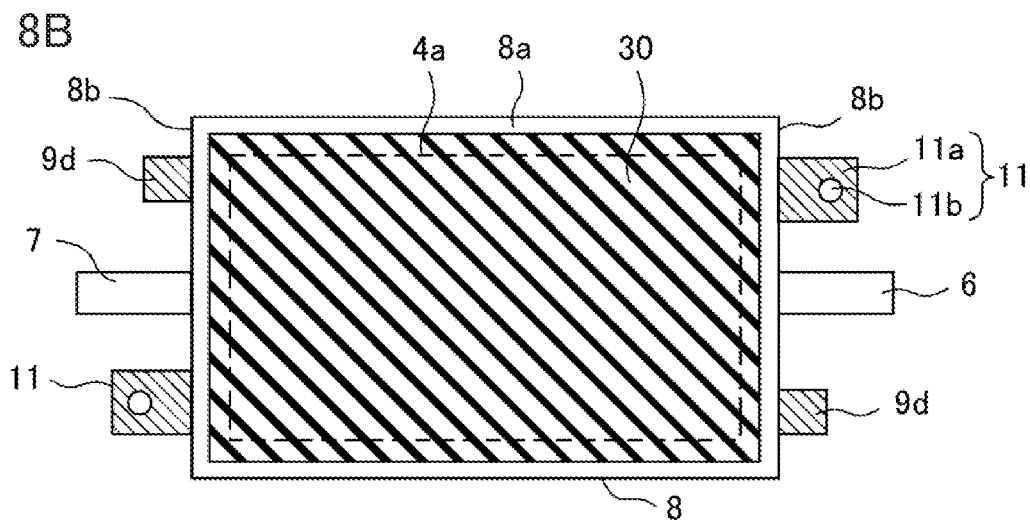

Modifications of the thickness-regulating and positioning protrusions 11 according to the second embodiment will be described with reference to FIGS. 8A and 8B. FIGS. 8A and 8B are sectional views of a part in a joining area indicated by line B-B as seen from the arrow direction in FIG. 5. In the modification shown in FIG. 8A, two thickness-regulating and positioning protrusions 11 are formed at each of the two side surfaces 8b of the sealing resin 8 where the main electrode wires 6, 7 are located. That is, the semiconductor module in this modification has four thickness regulating protrusions and four positioning protrusions.

In the modification shown in FIG. 8B, a second thickness regulating protrusion 9d and the thickness-regulating and positioning protrusion 11 for regulating the thickness of the solder 30 are formed at each of the two side surfaces 8b of the sealing resin 8 where the main electrode wires 6, 7 are located. That is, the semiconductor module in this modification has four thickness regulating protrusions and two positioning protrusions.

The protrusion lengths of the second thickness regulating protrusions 9d from the sealing resin 8 are not greater than the protrusion lengths of the main electrode wires 6, 7 from the sealing resin 8. In addition, each second thickness regulating protrusion 9d is provided with a space from the solder 30. In these modifications, since the thickness regulating protrusions 9 are not provided on the bottom 8a of the sealing resin 8, the outer size of the sealing resin 8 can be reduced.

According to the second embodiment, the same effects as those in the first embodiment are obtained, and in addition, since the thickness-regulating and positioning protrusions 11 are provided on the side surfaces 8b of the sealing resin 8 where the main electrode wires 6, 7 are located, the number of the thickness regulating protrusions 9 provided on the bottom 8a of the sealing resin 8 can be minimized, or it becomes unnecessary to provide the thickness regulating protrusions 9 on the bottom 8a of the sealing resin 8. Thus, the size of the semiconductor module 20A can be more reduced than in the first embodiment.

In addition, the thickness of the solder 30 can be made uniform by the thickness-regulating and positioning protrusions 11, and thus interface separation or crack of the solder 30 can be prevented. Further, since the thickness-regulating and positioning protrusions 11 are provided with the spaces 12 from the solder 30, interface separation or crack that would occur starting from the contact part between the thickness-regulating and positioning protrusion 11 and the solder 30 can be prevented, and thus the life of the joining part between the semiconductor module 20A and the cooler 40 can be ensured. From the above, according to the second embodiment, it is possible to obtain the semiconductor device 102 having enhanced heat dissipation property and reliability without increasing the outer size of the semiconductor module 20A.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

What is claimed is:

1. A semiconductor device comprising a semiconductor module, the semiconductor module including:
   a semiconductor element mounted at one surface of a metal member;
   a metal plate provided at another surface of the metal member with an insulation sheet interposed therebetween;
   a main electrode wire connected to the semiconductor element or the metal member; and
   a sealing resin sealing the semiconductor element, the metal member, the insulation sheet, and the metal plate, with one surface of the metal plate exposed, wherein
   the metal plate exposed from a bottom of the sealing resin and a cooling surface of a cooler are joined to each other via solder,
   one end of the main electrode wire protrudes from a side surface of the sealing resin,
   a positioning protrusion for positioning the semiconductor module and the cooler is formed at the side surface of the sealing resin from which the main electrode wire protrudes, and
   a thickness regulating protrusion keeping a distance between the cooling surface and the semiconductor module constant and regulating a thickness of the solder is formed at the side surface or the bottom of the sealing resin.

2. The semiconductor device according to claim 1, wherein
the positioning protrusion has a side surface protrusion protruding perpendicularly from the side surface of the sealing resin, and a distal end protrusion protruding toward the cooler from the side surface protrusion, and
the distal end protrusion is inserted into a recess formed in the cooling surface of the cooler.

3. The semiconductor device according to claim 1, wherein
the thickness regulating protrusions are formed in at least three locations on the bottom of the sealing resin.

4. The semiconductor device according to claim 1, wherein
the thickness regulating protrusion is formed at a peripheral part of the bottom of the sealing resin.

5. The semiconductor device according to claim 1, wherein
the thickness regulating protrusion is formed with a length not less than a width of the main electrode wire, at a location corresponding to the main electrode wire on the bottom of the sealing resin.

6. The semiconductor device according to claim 1, wherein
a space is provided between the thickness regulating protrusion and the solder.

7. The semiconductor device according to claim 1, wherein
one end of the main electrode wire connected to the semiconductor element and one end of the main electrode wire connected to the metal member respectively protrude from two opposite side surfaces of the sealing resin, and
the positioning protrusions are provided at least one by one at the respective two side surfaces.

8. The semiconductor device according to claim 1, wherein
the solder is joined to an entirety of the surface of the metal plate exposed from the bottom of the sealing resin.

9. The semiconductor device according to claim 1, wherein
the metal member has a side surface in an inverted taper shape.

10. The semiconductor device according to claim 1, wherein
the metal member has a cutout or a step at a side surface thereof.

11. The semiconductor device according to claim 1, wherein
the metal plate has a side surface in an inverted taper shape or a shape in which a center part thereof protrudes.

12. A semiconductor device comprising a semiconductor module, the semiconductor module including:
a semiconductor element mounted at one surface of a metal member;
a metal plate provided at another surface of the metal member with an insulation sheet interposed therebetween;
a main electrode wire connected to the semiconductor element or the metal member; and
a sealing resin sealing the semiconductor element, the metal member, the insulation sheet, and the metal plate, with one surface of the metal plate exposed, wherein
the metal plate exposed from a bottom of the sealing resin and a cooling surface of a cooler are joined to each other via solder,
one end of the main electrode wire protrudes from a side surface of the sealing resin,
a positioning protrusion for positioning the semiconductor module and the cooler is formed at the side surface of the sealing resin from which the main electrode wire protrudes, and
the positioning protrusion also serves as a thickness regulating protrusion keeping a distance between the cooling surface and the semiconductor module constant and regulating a thickness of the solder.

13. The semiconductor device according to claim 12, wherein
the positioning protrusion has a side surface protrusion protruding perpendicularly from the side surface of the sealing resin, and a distal end protrusion protruding toward the cooler from the side surface protrusion,
the side surface protrusion keeps the distance between the cooling surface and the semiconductor module constant, and
the distal end protrusion is inserted into a recess formed in the cooling surface of the cooler.

14. The semiconductor device according to claim 12, wherein
separately from the positioning protrusion, a thickness regulating protrusion keeping the distance between the cooling surface and the semiconductor module constant and regulating the thickness of the solder is formed at the side surface or the bottom of the sealing resin.

15. The semiconductor device according to claim 12, wherein
a space is provided between the positioning protrusion and the solder.

16. The semiconductor device according to claim 12, wherein
one end of the main electrode wire connected to the semiconductor element and one end of the main electrode wire connected to the metal member respectively protrude from two opposite side surfaces of the sealing resin, and
the positioning protrusions are provided at least one by one at the respective two side surfaces.

17. The semiconductor device according to claim 12, wherein
the solder is joined to an entirety of the surface of the metal plate exposed from the bottom of the sealing resin.

18. The semiconductor device according to claim 12, wherein
the metal member has a side surface in an inverted taper shape.

19. The semiconductor device according to claim 12, wherein
the metal member has a cutout or a step at a side surface thereof.

20. The semiconductor device according to claim 12, wherein
the metal plate has a side surface in an inverted taper shape or a shape in which a center part thereof protrudes.

* * * * *